(12) United States Patent
Li et al.

(10) Patent No.: US 9,640,276 B2
(45) Date of Patent: May 2, 2017

(54) SHIFT REGISTER UNIT AND GATE DRIVING CIRCUIT

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fuqiang Li, Beijing (CN); Cheng Li, Beijing (CN); Seong Jun An, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 318 days.

(21) Appl. No.: 14/375,049

(22) PCT Filed: Nov. 11, 2013

(86) PCT No.: PCT/CN2013/086888
§ 371 (c)(1),
(2) Date: Jul. 28, 2014

(87) PCT Pub. No.: WO2014/166251
PCT Pub. Date: Oct. 16, 2014

(65) Prior Publication Data
US 2016/0268004 A1  Sep. 15, 2016

(30) Foreign Application Priority Data

Apr. 10, 2013  (CN) .......................... 2013 1 0122415

(51) Int. Cl.
*G11C 19/00* (2006.01)
*G11C 19/28* (2006.01)
*G09G 3/36* (2006.01)

(52) U.S. Cl.
CPC ........... *G11C 19/28* (2013.01); *G09G 3/3648* (2013.01); *G09G 3/3674* (2013.01);
(Continued)

(58) Field of Classification Search
None
See application file for complete search history.

(56) References Cited

U.S. PATENT DOCUMENTS

2009/0122951 A1* 5/2009 Tobita .................... G11C 19/28
377/68
2010/0026669 A1* 2/2010 Lee ........................ G11C 19/28
345/204

(Continued)

FOREIGN PATENT DOCUMENTS

CN         102629444 A    8/2012
CN         102956213 A    3/2013
(Continued)

OTHER PUBLICATIONS

International Preliminary Report on Patentability Appln. No. PCT/CN2013/086888; Dated Oct. 13, 2015.
(Continued)

*Primary Examiner* — Lincoln Donovan
*Assistant Examiner* — Khareem E Almo
(74) *Attorney, Agent, or Firm* — Ladas & Parry LLP (57) ABSTRACT

The present disclosure relates to the technical field of communication. There is provided a shift register unit and a gate driving circuit for decreasing noise interferences, enhancing stability of the shift register unit, and at the same reducing the size of the shift register unit. The shift register (Continued)

unit comprises: an input module configured to provide a first voltage signal to an output terminal in response to an input signal; a reset module configured to provide a second voltage signal to a first node as an output terminal of the input module in the input module in response to a reset signal; an output module configured to provide a first clock signal to the output terminal in response to a voltage at a first node; a pull-down control module configured to provide a second clock signal to a second node in response to the second clock signal and provide a power supply negative voltage to the second node in response to the voltage at the first node or the voltage at the output terminal; and a pull-down module configured to provide the power supply negative voltage to the first node and the output terminal in response to the voltage at the second node.

11 Claims, 4 Drawing Sheets

(52) U.S. Cl.
 CPC . *G09G 2300/04* (2013.01); *G09G 2310/0286* (2013.01); *G09G 2310/08* (2013.01)

(56) References Cited

U.S. PATENT DOCUMENTS

| | | | |
|---|---|---|---|
| 2011/0221736 A1 | 9/2011 | Pak et al. | |
| 2013/0088265 A1* | 4/2013 | Chen | H03K 5/153 327/108 |
| 2014/0056399 A1* | 2/2014 | Shang | G11C 19/28 377/68 |
| 2014/0098013 A1* | 4/2014 | Chen | G09G 3/3677 345/92 |
| 2014/0098015 A1* | 4/2014 | Wang | G09G 3/3677 345/100 |
| 2014/0119492 A1* | 5/2014 | Liu | G11C 19/28 377/64 |
| 2014/0168049 A1* | 6/2014 | Gu | G09G 3/3685 345/100 |
| 2014/0176410 A1* | 6/2014 | Ma | G09G 3/3622 345/92 |
| 2014/0177780 A1* | 6/2014 | Qi | G09G 3/20 377/64 |
| 2014/0192039 A1* | 7/2014 | Wang | G11C 19/28 345/213 |
| 2014/0240209 A1* | 8/2014 | Zhang | G09G 3/3648 345/92 |
| 2015/0332784 A1* | 11/2015 | Yan | G11C 19/28 377/64 |
| 2015/0380107 A1* | 12/2015 | Chen | G09G 3/3677 345/100 |
| 2016/0064097 A1* | 3/2016 | Yang | G11C 19/28 345/205 |
| 2016/0125954 A1* | 5/2016 | Gu | G11C 19/28 377/64 |
| 2016/0125955 A1* | 5/2016 | Pang | G11C 19/287 377/64 |
| 2016/0172054 A1* | 6/2016 | Shao | G11C 19/184 345/100 |
| 2016/0210890 A1* | 7/2016 | Lim | G09G 3/00 |

FOREIGN PATENT DOCUMENTS

| | | |
|---|---|---|
| CN | 202838909 U | 3/2013 |
| CN | 103226981 A | 7/2013 |

OTHER PUBLICATIONS

First Chinese Office Action dated May 26, 2015; Appln No. 201310122415.1.
International Search Report Appln. No. PCT/CN2013/086888; Dated Feb. 27, 2014.

* cited by examiner

SHIFT REGISTER UNIT AND GATE DRIVING CIRCUIT

TECHNICAL FIELD

The present disclosure relates to the technical field of communication, in particular to a shift register unit and a gate driving circuit.

BACKGROUND

A thin film transistor liquid crystal display (TFT-LCD) driver mainly comprises a gate driver and a data driver, wherein the gate driver applies an input clock signal transformed by a shift register unit to a gate line of a liquid crystal display panel. A gate driving circuit can have the same process as the forming of TFT and form on the LCD panel together with the TFT simultaneously. The gate driving circuit comprises multiple stages of shift register units, each of which is connected to a corresponding gate line to output a gate driving signal. Respective stages of the gate driving circuit are connected with each other. A start signal is inputted to a first stage of the respective stages and the gate driving signal is sequentially outputted to the gate line, wherein an input terminal of a present stage is connected to an output terminal of a previous stage, and an output terminal of a next stage is connected to a control terminal of the present stage.

Figure 1:
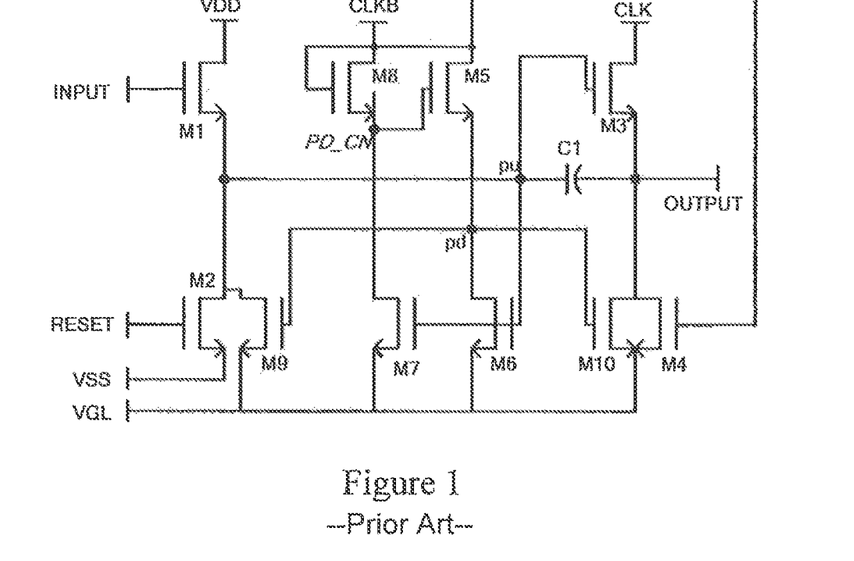
FIG. 1 is a schematic diagram of a structure of a shift register unit as known in the art.

The gate driving circuit of the above structure is disposed on the LCD panel, and its each stage of shift register unit comprises a structure as shown in FIG. 1. The shift register unit as shown in FIG. 1 comprises ten thin film transistors M1-M10 and one capacitor C1 and is configured to realize outputting and resetting functions of the shift register unit. However, change of respective alternating current clock signals in the gate driving circuit will cause interference noise to occur in the circuit, which affects the output of signal and the stability of the shift register unit; at the same time, a greater number of thin film transistors need a larger wiring space, so that the whole shift register unit has a big size, thereby causing that the liquid crystal display has a large volume.

SUMMARY

In order to solve the above technical problem existing in the prior art, embodiments of the present disclosure provide a shift register unit and a gate driving circuit, which are configured to suppress interference noise due to change of an alternating current clock signal. The use of a direct current pull-down mode can effectively enhance stability of the shift register unit, and at the same time reduce the size of the shift register unit.

According to an embodiment of the present disclosure, there is provided a shift register unit comprising an input module, a reset module, an output module, a pull-down control module and a pull-down module, wherein, the input module is connected to an input signal terminal, a first voltage signal terminal and an output terminal respectively and is configured to provide a first voltage signal inputted from the first voltage signal terminal to the output terminal in response to a signal inputted from the input signal terminal;

the reset module is connected to a reset signal terminal, a second voltage signal terminal and a first node respectively and is configured to provide a second voltage signal inputted from the second voltage signal terminal to the first node\ in response to a reset signal outputted from the reset signal terminal, the first node being a connecting point of the reset module and the input module;

the output module is connected to the first node, a first clock signal terminal and the output terminal respectively and is configured to provide a first clock signal inputted from the first clock signal terminal to the output terminal in response to a voltage at the first node;

the pull-down control module is connected to the first node, a second node, a second clock signal terminal, the output terminal and a power supply negative voltage terminal respectively and is configured to provide a second clock signal to the second node of the pull-down control module in response to the second clock signal inputted from the second clock signal terminal and provide a power supply negative voltage inputted from the power supply negative voltage terminal to the second node in response to a voltage at the first node or a voltage at the output terminal, the second node being a connecting point of the pull-down control module and the pull-down module;

the pull-down module is connected to the first node, the second node, the power supply negative voltage terminal and the output terminal respectively and is configured to provide the power supply negative voltage inputted from the power supply negative terminal to the first node and the output terminal in response to the voltage at the second node.

According to an embodiment of the present disclosure, there is provided a gate driving circuit, comprising respective stages of shift register units connected in cascade, wherein an input signal terminal of a first stage of shift register unit is connected to a start signal terminal, and a reset signal terminal thereof is connected to an output terminal of a second stage of shift register unit; an input signal terminal of a last stage of shift register unit is connected to an output terminal of a previous stage of shift register unit, and a reset signal terminal thereof is connected to the start signal terminal;

except for the first and the last stages of shift register units, an input signal terminal of each of remaining stages of shift register units is connected to an output terminal of previous stage of shift register unit, and a reset signal terminal thereof is connected to an output terminal of next stage of shift register unit;

all the shift register units connected in cascade are the shift register unit.

There provide a shift register unit and a gate driving circuit according to the embodiments of the present disclosure, the shift register unit comprises the input module, the reset module, the output module, the pull-down control module and the pull-down module, wherein the input module is connected to the input signal terminal and is configured to provide the first voltage signal to the output terminal in response to the input signal; the reset module is connected to the reset signal terminal and is configured to provide the second voltage signal to the input module as the first node of the output terminal of the input module in response to the reset signal; the output module is configured to provide the first clock signal to the output terminal in response to the voltage at the first node; the pull-down control module is configured to provide the second clock signal to the second node of the pull-down control module in response to the second clock signal, provide the power supply negative voltage to the second node in response to the voltage at the first node, and provide the power supply negative voltage to the second node in response to the voltage at the output terminal; and the pull-down module is configured to provide the power supply negative voltage to the first node and the output terminal in response to the voltage at the second node. By using a small number of thin film transistors, the shift register unit, realizes a signal transmitting function and a noise reducing function of the shift register unit, suppresses an output error due to drift of threshold voltages of elements per se and interferences of adjacent elements, and further enhances the output characteristic of the shift register and service life of the transistors; at the same time, the wiring space is saved because of the use of a small number of thin film transistors, which is beneficial to reduce the size of the shift register unit, so as to reduce the volume of the whole liquid crystal display.

DETAILED DESCRIPTION

There are provide in embodiments of the present disclosure a shift register unit and a gate driving circuit, which are configured to suppress interference noise due to change of an alternating current clock signal. The use of a direct current pull-down mode can effectively enhance stability of the shift register unit, and at the same reduce the size of the shift register unit.

In order to better understand the technical solutions of the present disclosure, exemplary embodiments of the present disclosure will be specified in detail in combination with the accompanying figures.

Figure 2:
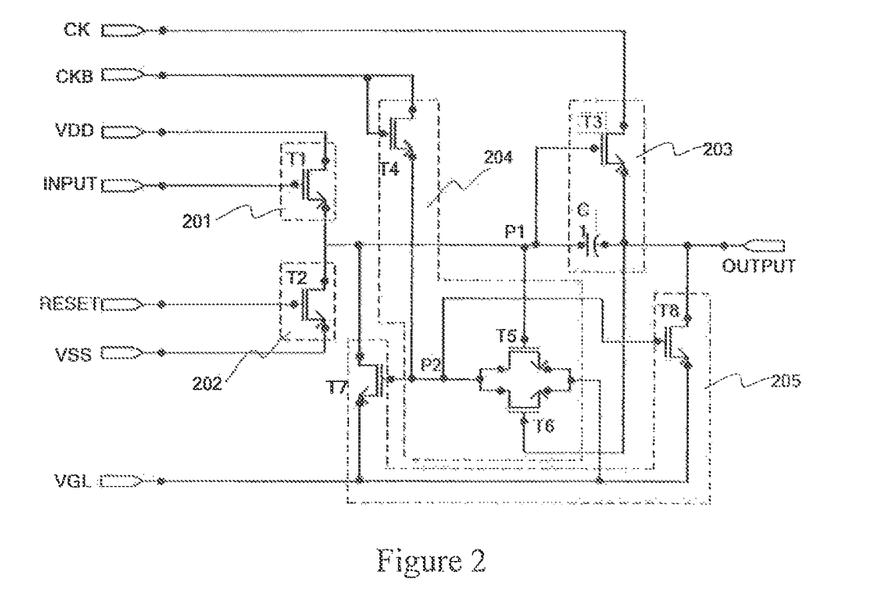
FIG. 2 is a schematic diagram of a structure of a shift register unit according to a first embodiment of the present disclosure.

According to a first embodiment of the present disclosure, there is provided a shift register unit, and its structure is as shown in FIG. 2. It can be seen from FIG. 2 that the shift register unit comprises: an input module 201, a reset module 202, an output module 203, a pull-down control module 204 and a pull-down module 205.

The input module 201 is connected to an input signal terminal INPUT, a first voltage signal terminal VDD and an output terminal OUTPUT respectively and is configured to provide a first voltage signal inputted from the first voltage signal terminal VDD to the output terminal OUTPUT in response to a signal inputted from the input signal terminal INPUT.

The reset module 202 is connected to a reset signal terminal RESET, a second voltage signal terminal VSS and a first node P1 respectively and is configured to provide a second voltage signal inputted from the second voltage signal terminal VSS to the first node P1 in response to a reset signal outputted from the reset signal terminal RESET, the first node P1 being a connecting point of the reset module 202 and the input module 201.

The output module 203 is connected to the first node P1, a first clock signal terminal CK and the output terminal OUTPUT respectively and is configured to provide a first clock signal inputted from the first clock signal terminal CK to the output terminal OUTPUT in response to a voltage at the first node P1.

The pull-down control module 204 is connected to the first node P1, a second node P2, a second clock signal terminal CKB, the output terminal OUTPUT and a power supply negative voltage terminal VGL respectively and is configured to provide a second clock signal to the second node P2 of the pull-down control module 204 in response to the second clock signal inputted from the second clock signal terminal CKB and provide a power supply negative voltage inputted from the power supply negative voltage terminal VGL to the second node P2 in response to a voltage at the first node P1 or a voltage at the output terminal OUTPUT, the second node P2 being a connecting point of the pull-down control module 204 and the pull-down module 205.

The pull-down module 205 is connected to the first node P1, the second node P2, the power supply negative voltage terminal VGL and the output terminal OUTPUT respectively and is configured to provide the power supply negative voltage inputted from the power supply negative terminal VGL to the first node and the output terminal OUTPUT in response to the voltage at the second node P2.

The present disclosure will be described in detail in combination with specific embodiments. It is needed to specify that the present embodiment is used for explaining the present disclosure to the better rather than limiting the present disclosure.

The shift register unit as shown in FIG. 2 comprises the input module 201, the reset module 202, the output module 203, the pull-down control module 204 and the pull-down module 205.

In particular, the input module 201 comprises:

a first thin film transistor T1, whose gate is connected to the input signal terminal INPUT, drain is connected to the first voltage signal terminal VDD, and source is connected to the first node P1.

The reset module 202 comprises:

a second thin film transistor T2, whose gate is connected to the reset signal terminal RESET, drain is connected to the first node P1, and source is connected to the second voltage signal terminal VSS.

The output module 203 comprises:

a third thin film transistor T3, whose gate is connected to the first node P1, drain is connected to the first clock signal terminal CK, and source is connected to the output terminal OUTPUT;

a first capacitor C1, whose first terminal is connected to the first node P1, and second terminal is connected to the output terminal OUTPUT.

The pull-down control module 204 comprises:

a fourth thin film transistor T4, whose gate and drain are simultaneously connected to the second clock signal terminal CKB, and source is connected to the second node P2;

a fifth thin film transistor T5, whose gate is connected to the first node P1, source is connected to the power supply negative voltage terminal VGL, and drain is connected to the first node P1;

a sixth thin film transistor T6, whose gate is connected to the output terminal OUTPUT, drain is connected to the second node P2, and source is connected to the power supply negative voltage terminal VGL.

The pull-down module 205 comprises:

a seventh thin film transistor T7, whose gate is connected to the second node P2, source is connected to the power supply negative voltage terminal VGL, and drain is connected to the first node P1;

an eighth thin film transistor T8, whose gate is connected to the second node P2, drain is connected to the output terminal OUTPUT, and source is connected to the power supply negative voltage terminal VGL.

Alternatively, all the above transistors are N-type thin film transistors TFTs. At the same time, all the above transistors are simultaneously polysilicon thin film transistors or simultaneously amorphous silicon thin film transistors.

The above shift register unit adopts a method of direct current pulling down or pulling up the first node P1 and the second node P2, which suppresses an output error due to drift of threshold voltages of elements per se and interference of adjacent elements, and solves the problem of too much noise in the prior art; at the same time, the wiring space is saved because of the use of a small number of thin film transistors in the above shift register unit, which is beneficial to reduce the size of the shift register unit, so as to reduce the volume of the whole liquid crystal display.

Figure 3:
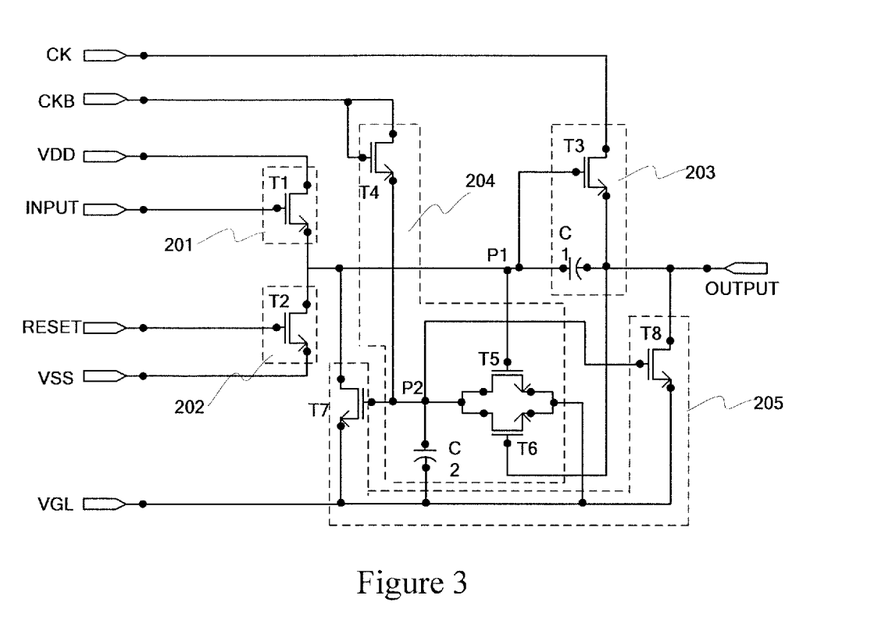
FIG. 3 is a schematic diagram of a structure of a shift register unit according to a second embodiment of the present disclosure.

According to a second embodiment of the present disclosure, there is provided a shift register unit, and its structure is as shown in FIG. 3. It can be seen from FIG. 3 that the shift register unit also comprises the input module 201, the reset module 202, the output module 203, the pull-down control module 204 and the pull-down module 205. The shift register unit as shown in FIG. 3 differs from the shift register unit as shown in FIG. 2 in:

in the shift register unit as shown in FIG. 3, the pull-down control module 204 further comprises a second capacitor C2 connected between the second node P2 and the power supply negative voltage terminal VGL, is configured to keep a high potential after an output of the output terminal OUTPUT; if there is no the second capacitor C2, the shift register unit as shown in FIG. 2 can also keep the high potential depending on a parasitic capacitor of the thin film transistor. However, there is a leakage current in the fifth thin film transistor T5 and the sixth thin film transistor T6, which will cause the second node P2 to discharge, thereby producing noise and making certain affect on the output of the signal; on the contrary, after the second capacitor C2 is set in the circuit, since there is C1 that can keep the high potential after the output of the output terminal OUTPUT, the existence of the second capacitor C2 can greatly reduce the noise at the second node P2.

The above shift register units are connected in cascade to form an array substrate gate driving circuit. According to a third embodiment of the present disclosure, there is provided a gate driving circuit, comprising respective stages of the shift register units connected in cascade, wherein an input signal terminal of a first stage of shift register unit is connected to a start signal terminal, and a reset signal terminal thereof is connected to an output terminal of a second stage of shift register unit; an input signal terminal of a last stage of shift register unit is connected to an output terminal of a previous stage of shift register unit, and a reset signal terminal thereof is connected to the start signal terminal.

Except for the first and the last stages of shift register units, an input signal terminal of each of the remaining stages of shift register units is connected to the output terminal of the previous stage of shift register unit, and a reset signal terminal thereof is connected to the output terminal of next stage of shift register unit;

All the shift register units connected in cascade are the shift register unit as shown in FIG. 2 or the shift register unit as shown in FIG. 3.

Figure 4:
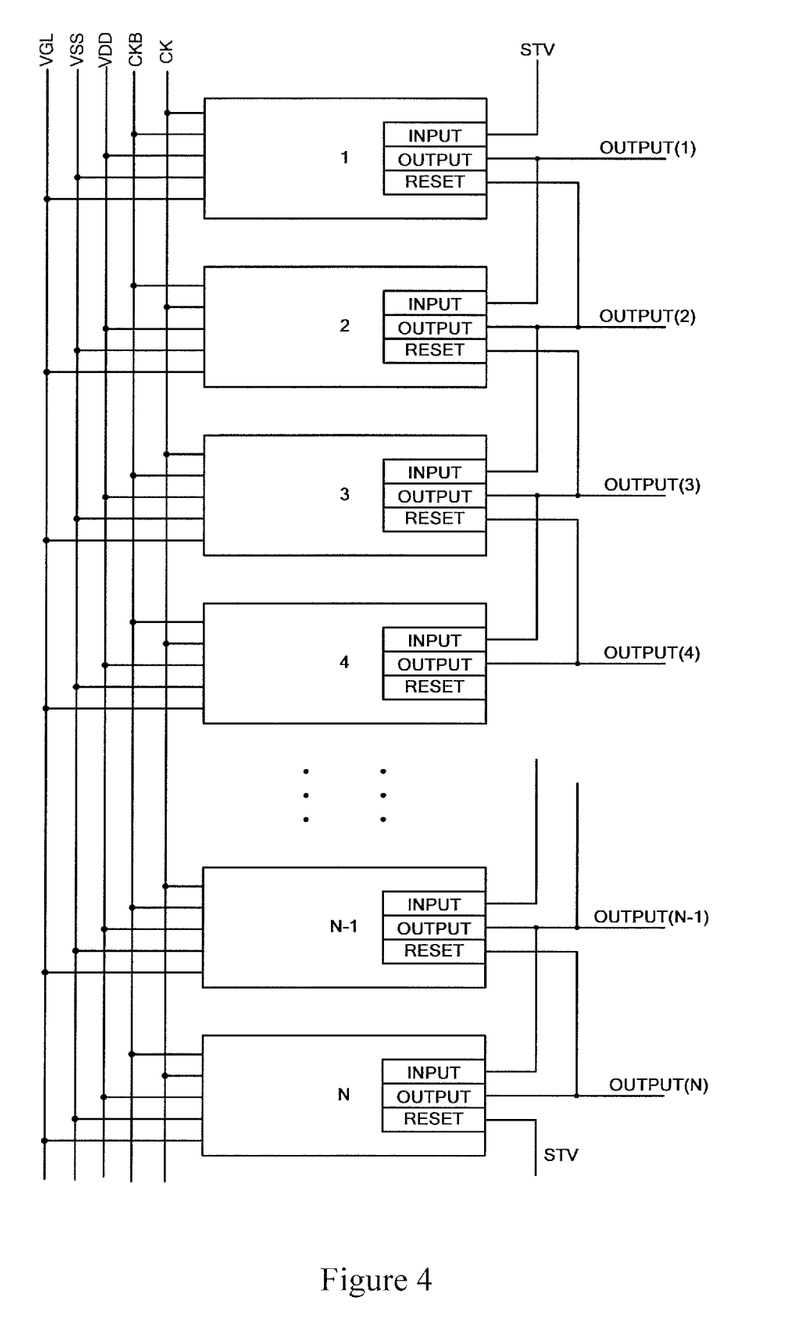
FIG. 4 is a schematic diagram of a structure of a gate driving circuit according to a third embodiment of the present disclosure.

In particular, the array substrate gate driving circuit comprises N stages, N being the number of gate lines. Referring to FIG. 4, the start signal STV is inputted to the first stage of shift register unit as an input signal, the gate driving signal is sequentially outputted to the gate lines, and the input signal of the n-th stage is provided by the output signal of the (n−1)-th stage, wherein n<N.

Figure 5:
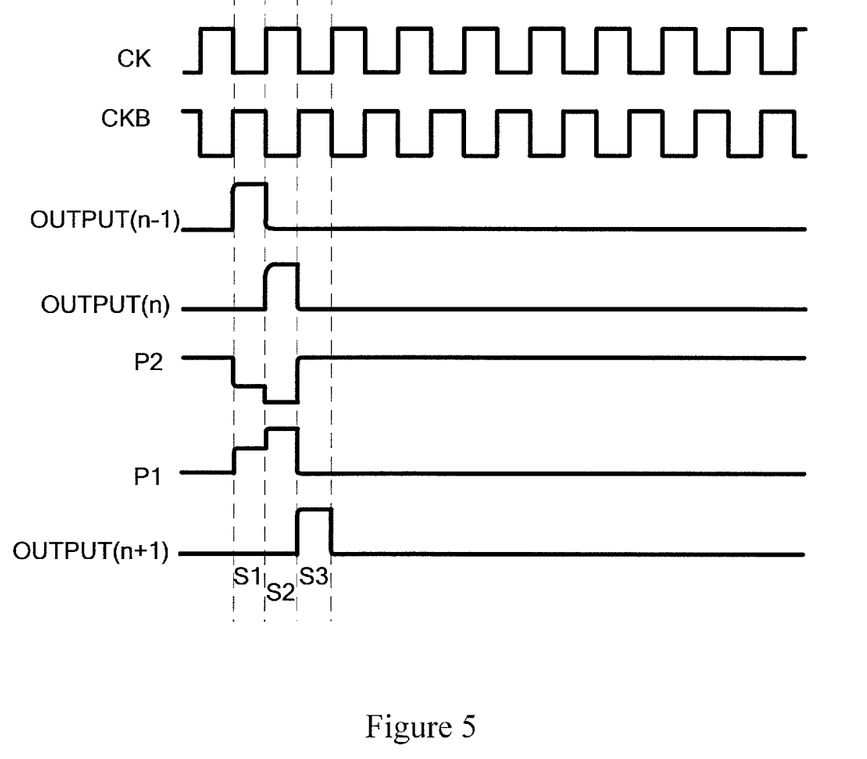
FIG. 5 is a timing signal diagram of respective signal terminals of a shift register unit according to a fourth embodiment of the present disclosure.

FIG. 5 is a timing diagram of respective signal terminals of an shift register unit according to a fourth embodiment of the present disclosure. The operating method of the n-th (n<N, N is the number of stages of the array substrate gate circuit) stage of shift register unit in the array substrate gate driving circuit provided in the embodiment of the present disclosure will be described below in combination with FIG. 5, wherein all the shift register units are the shift register unit as shown in FIG. 2, and all the TFTs are turned on at a high level and turned off at a low level.

When the gate driving circuit scans forward, the first voltage signal is a high level signal VDD, and the second voltage signal is a low level signal VSS.

First stage S1: the first clock signal CK is at the low level, the second clock signal CKB is at the high level, the output signal OUTPUT(n−1) of the previous stage as the input signal is at the high level, and the output signal OUTPUT(n+1) of the next stage as the reset signal is at the low level; the output signal OUTPUT(n−1) at the high level makes the transistor T1 turned on, and the first voltage signal charges the firs node P1, so that the first node P1 is at the high level. At this time, a gate switch of the third thin film transistor T3 is switched on, and the output terminal OUTPUT(n) outputs the low voltage.

At the same time, the second clock signal CKB at the high level makes the fourth thin film transistor T4 turned on, and charges the second node P2 through the fourth thin film transistor T4; however, since the fifth thin film transistor T5 in response to the voltage at the first node P1 is also in a turn-on state, the second node P2 will discharge through the fifth thin film transistor T5, and at this time, the second node P2 is at the low level.

Second stage S2: the first clock signal CK is at the high level, the second clock signal CKB is at the low level, the output signal OUTPUT(n−1) of the previous stage as the input signal is at the low level and the output signal OUTPUT(n+1) of the next stage as the reset signal is at the low level.

Since the first node P1 is at the high level, the third thin film transistor T3 is in a turn-on stage, and at the same time, the CK is at the high level; due to the bootstrap effect of the first capacitor C1, the voltage at the first node P1 continues to rise, T3 continues to be turned on, the first node P1 is further pulled up, and the OUTPUT(n) outputs the high level.

At the same time, the sixth thin film transistor T6 in response to the voltage at the output terminal is also turned on, the fifth thin film transistor T5 and the sixth thin film transistor T6 simultaneously discharge the second node P2, and at this time, the voltage at the second node P2 is further reduced, and the seventh thin film transistor T7 and the eighth thin film transistor T8 in response to the voltage at the second node P2 are turned off.

Third stage S3: the first clock signal CK is at the low level, the second clock signal CKB is at the high level, the output signal OUTPUT(n−1) of the previous stage as the input signal is at the low level, and output signal OUTPUT (n+1) of the next stage as the reset signal is at the high level; the second thin film transistor T2 is turned on and provides the second voltage signal VSS to the first node P1, and thus the first node P1 is rapidly reduced to the low level and the third thin film transistor T3 and the fifth thin film transistor T5 in response to the voltage at the first node are turned off; the second node P2 provides the high level for the second clock signal, and at this time, the seventh thin film transistor T7 and the eighth thin film transistor T8 are turned on to discharge the two terminals of the first capacitor C1, i.e., quickly discharging the output terminal OUTPUT(n) to make the output at the low level, and at this time, the sixth thin film transistor T6 is turned on, thereby realizing the reset function.

When the gate driving circuit scans backwards, the first voltage signal is the low level signal VSS, the second voltage signal is the high level signal VDD, the INPUT terminal is taken as the reset signal terminal, and the RESET terminal is taken as the input signal terminal.

The input signal terminal of the last stage of shift register unit is connected to the start signal terminal, and the reset signal terminal thereof is connected to the output terminal of the previous stage of the shift register unit.

Except for the first and the last stages of the shift register units, the input signal terminal of the n-th stage of shift register unit is connected to the output terminal of the (n+1)-th stage of shift register unit. At the same time, the reset signal terminal of the n-th stage of shift register unit is connected to the output terminal of the (n−1)-th stage of shift register unit.

The operation principle when scanning backwards is the same as that of the scanning forward, and thus the description is not repeated herein.

Figure 6:
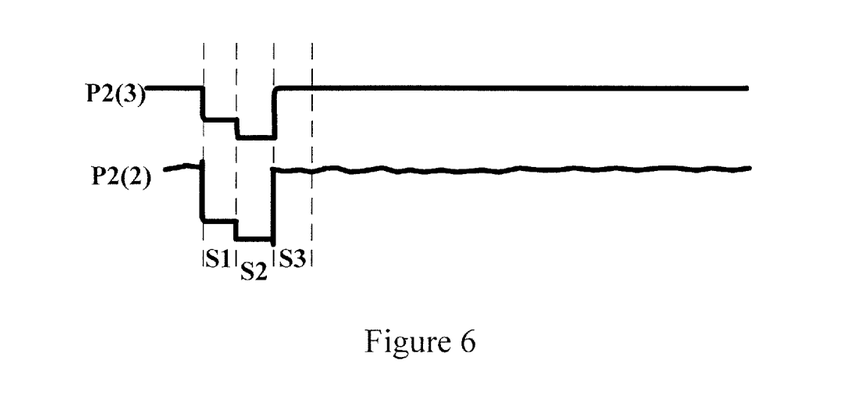
FIG. 6 is a timing signal diagram of a second node in different gate driving circuits.

When the shift register unit in the gate driving circuit is the shift register unit as shown in FIG. 3, its operating principle is the same as the operation principle of the gate driving circuit composed by the shift register units as shown in FIG. 2. Referring to FIG. 6, P2(2) in FIG. 6 represents the timing diagram of the second node when the gate driving circuit composed by the shift register units as shown in FIG. 2, and P2(3) represents the timing diagram of the second node when the gate driving circuit composed by the shift register units as shown in FIG. 3. It can be seen from FIG. 6 that, there is the second capacitor C2 set in the shift register unit as shown in FIG. 3, and the second capacitor C2 can keep the high potential at the second node P2, can decrease the affect of the leakage current existing in the fifth thin film transistor T5 and the sixth thin film transistor T6 and reduce the noise at the second node, and therefore after the capacitor C2 is added, the high level potential at the second node P2 will be more stable, thereby further enhancing the stability of the shift register unit.

To sum up, the embodiments of the present disclosure provide the shift register unit and the gate driving circuit. The shift register unit comprises: the input module, the reset module, the output module, the pull-down control module and the pull-down module, wherein the input module is connected the input signal and is configured to provide the first voltage signal to the output terminal in response to the input signal; the reset module is connected to the reset signal terminal and is configured to provide the second voltage signal to the first node as the output terminal of the input module in the input module in response to the reset signal; the output module provides the first clock signal to the output terminal in response to the voltage at the first node; the pull-down control module provides the second clock signal to the second node of the pull-down control unit in response to the second clock signal, and provides the power supply negative voltage to the second node in response to the voltage at the first node or the voltage at the output terminal; the pull-down module provides the power supply negative voltage to the first node and the output terminal in response to the voltage at the second node. The shift register unit uses a small number of thin film transistors and adopts the direct current pull-down mode to suppress the interference noise due to the change of the alternative current clock signal and realize the signal transmitting function and the noise reducing function of the shift register unit. At the same time, the wiring space is saved because of the use of a small number of thin film transistors, which is useful to reduce the size of the shift register unit, so as to reduce the volume of the whole liquid crystal display.

Obviously, those skilled in the art can male various alternations and modifications to the embodiments of the present disclosure without departing from the spirit and scope of the present disclosure. As such, if these alternations and modifications made to the embodiments of the present disclosure belong to the scope of the claims of the present disclosure as well as its equivalents, the present invention intends to include these alternations and modification.

What is claimed is:

1. A shift register unit comprising an input module, a reset module, an output module, a pull-down control module and a pull-down module, wherein, the input module is connected to an input signal terminal, a first voltage signal terminal and an output terminal respectively, and is configured to provide a first voltage signal inputted from the first voltage signal terminal to the output terminal in response to a signal inputted from the input signal terminal;

the reset module is connected to a reset signal terminal, a second voltage signal terminal and a first node respectively, and is configured to provide a second voltage signal inputted from the second voltage signal terminal to the first node in response to a reset signal outputted from the reset signal terminal, the first node being a connecting point of the reset module and the input module;

the output module is connected to the first node, a first clock signal terminal and the output terminal respectively, and is configured to provide a first clock signal inputted from the first clock signal terminal to the output terminal in response to a voltage at the first node;

the pull-down control module is connected to the first node, a second node, a second clock signal terminal, the output terminal and a power supply negative voltage terminal respectively, and is configured to provide a second clock signal to the second node of the pull-down control module in response to the second clock signal inputted from the second clock signal terminal, and provide a power supply negative voltage inputted from the power supply negative voltage terminal to the second node in response to a voltage at the first node or a voltage at the output terminal, the second node being a connecting point of the pull-down control module and the pull-down module;

the pull-down module is connected to the first node, the second node, the power supply negative voltage terminal and the output terminal respectively, and is configured to provide the power supply negative voltage inputted from the power supply negative terminal to the first node and the output terminal in response to the voltage at the second node; and wherein the input module comprises:
a first thin film transistor, whose gate is connected to the input signal terminal, drain is connected to the first voltage signal terminal, and source is connected to the first node wherein the reset module comprises:
second thin film transistor, whose gate is connected to the reset signal terminal, drain is connected to the first node, and source is connected to the second voltage signal terminal:

wherein the output module comprises:
a third thin film transistor, whose gate is connected to the first node, drain is connected to the first clock signal terminal, and source is connected to the output terminal;
a first capacitor, connected between the first node and the outtput terminal; and wherein pull-down control module comprises:
a fourth thin film transistor, whose gate and drain are simultaneously connected to the second clock signal terminal, and source is connected to the second node;
a fifth thin film transistor, whose gate is connected to the first node, source is connected to the power supply negative voltage terminal, and drain is connected to the first node; and
sixth thin film transistor, whose gate is connected to the output terminal, drain is connected to the second node, and source is connected to the power supply negative voltage terminal.

2. The shift register unit according to claim 1, wherein the pull-down control module further comprises:
a second capacitor, connected between the second node and the power supply negative voltage.

3. The shift register unit according to claim 2, wherein the pull-down module comprises:
a seventh thin film transistor, whose gate is connected to the second node, source is connected to the power supply negative voltage terminal, and drain is connected to the first node; and
an eighth thin film transistor, whose gate is connected to the second node, drain is connected to the output terminal, and source is connected to the power supply negative voltage terminal.

4. The shift register unit according to claim 3, wherein all the thin film transistors are N-type thin film transistors.

5. A gate driving circuit comprising respective stages of shift register units connected in cascade, wherein an input signal terminal of a first stage of shift register unit is connected to a start signal terminal, and a reset signal terminal thereof is connected to an output terminal of a second stage of shift register unit; an input signal terminal of a last stage of shift register unit is connected to an output terminal of a previous stage of shift register unit, and a reset signal terminal thereof is connected to a start signal terminal;
except for the first and the last stages of shift register units, an input signal terminal of each of remaining stages of shift register units is connected to an output terminal of previous stage of shift register unit, and a reset signal terminal thereof is connected to an output terminal of next stage of shift register unit;
wherein, all the shift register units connected in cascade are the shift register unit according to claim 1.

6. The gate driving circuit according to claim 5, wherein the input module comprises:
a first thin film transistor, whose gate is connected to the input signal terminal, drain is connected to the first voltage signal terminal, and source is connected to the first node.

7. The gate driving circuit according to claim 6, wherein the reset module comprises:
a second thin film transistor, whose gate is connected to the reset signal terminal, drain is connected to the first node, and source is connected to the second voltage signal terminal.

8. The gate driving circuit according to claim 7, wherein the output module comprises:
a third thin film transistor, whose gate is connected to the first node, drain is connected to the first clock signal terminal, and source is connected to the output terminal;
a first capacitor, connected between the first node and the output terminal.

9. The gate driving circuit according to claim 8, wherein pull-down control module comprises:
a fourth thin film transistor, whose gate and drain are simultaneously connected to the second clock signal terminal, and source is connected to the second node;
a fifth thin film transistor, whose gate is connected to the first node, source is connected to the power supply negative voltage terminal, and drain is connected to the first node; and
a sixth thin film transistor, whose gate is connected to the output terminal, drain is connected to the second node, and source is connected to the power supply negative voltage terminal.

10. The gate driving circuit according to claim 9, wherein the pull-down control module further comprises:
a second capacitor, connected between the second node and the power supply negative voltage.

11. The gate driving circuit according to claim 10, wherein the pull-down module comprises:
a seventh thin film transistor, whose gate is connected to the second node, source is connected to the power supply negative voltage terminal, and drain is connected to the first node; and
an eighth thin film transistor, whose gate is connected to the second node, drain is connected to the output terminal, and source is connected to the power supply negative voltage terminal.

* * * * *